(12) United States Patent
Tay

(10) Patent No.: US 7,442,974 B2
(45) Date of Patent: Oct. 28, 2008

(54) IMAGE SENSOR WITH INTER-PIXEL ISOLATION

(76) Inventor: Hiok Nam Tay, Blk. 409, Woodlands St. 41, #13-109, 730409 Singapore (SG)

( * ) Notice: Subject to any disclaimer, the term of this patent is extended or adjusted under 35 U.S.C. 154(b) by 69 days.

(21) Appl. No.: 11/701,280

(22) Filed: Jan. 31, 2007

(65) Prior Publication Data

US 2007/0200152 A1 Aug. 30, 2007

Related U.S. Application Data

(60) Provisional application No. 60/764,288, filed on Jan. 31, 2006.

(51) Int. Cl.
*H01L 31/062* (2006.01)
(52) U.S. Cl. ........................ 257/291; 438/141
(58) Field of Classification Search ................ 257/291, 257/292, 219, 220, 461–463, E31.053, E31.037, 257/E27.131, E27.133; 438/66, 141, 217, 438/220, 224, 527
See application file for complete search history.

(56) References Cited

U.S. PATENT DOCUMENTS

| | | | |
|---|---|---|---|
| 6,169,318 B1 * | 1/2001 | McGrath | ............... 257/445 |
| 6,795,117 B2 | 9/2004 | Tay | |
| 6,878,568 B1 | 4/2005 | Rhodes et al. | |
| 6,909,162 B2 | 6/2005 | Wu et al. | |
| 7,091,536 B2 | 8/2006 | Rhodes et al. | |

\* cited by examiner

*Primary Examiner*—David Vu
(74) *Attorney, Agent, or Firm*—Ben J. Yorks; Irell & Manella LLP

(57) ABSTRACT

An image sensor with a plurality of photodiodes that each have a first region constructed from a first type of material and a second region constructed from a second type of material. Located adjacent to the first region and between second regions of adjacent photodiodes is a barrier region. The photodiodes are reversed biased to create depletion regions within the first regions. The barrier region limits the lateral growth of the depletions regions and inhibits depletion merger between adjacent photodiodes.

14 Claims, 2 Drawing Sheets

__US 7,442,974 B2__

IMAGE SENSOR WITH INTER-PIXEL ISOLATION

REFERENCE TO CROSS RELATED APPLICATION

This application claims priority under 35 U.S.C §119(e) to provisional application No. 60/764,288 filed on Jan. 31, 2006.

BACKGROUND OF THE INVENTION

1. Field of the Invention

The subject matter disclosed generally relates to the field of semiconductor image sensors.

2. Background Information

Photographic equipment such as digital cameras and digital camcorders may contain electronic image sensors that capture light for processing into still or video images, respectively. Electronic image sensors typically contain millions of light capturing elements such as photodiodes. The photodiodes are arranged in a two-dimensional pixel array.

FIG. 1 shows an enlarged cross-section of pixels in a pixel array of the prior art. The pixels include first regions 1 constructed from a first type of material, typically p-type, and second regions 2 constructed from a second type of material, typically n-type. The regions 1 and 2 form p-n junctions of photodiodes. The p-n junctions are reversed biased to form depletion regions between dashed lines 3 and 4. The photons of incoming light 5 are absorbed to create electron-hole pairs 6. The electrons move to create an electrical current. The current is ultimately sensed and processed to reproduce the image detected by the image sensor.

Light at relatively long wavelengths penetrate deep into the photodiodes. Consequently, electrons are formed at the outer edges of the depletion regions. The depletion regions can grow and actually merge in region 7. The merger of depletion regions electronically couples the adjacent photodiodes in a capacitance manner. A change in voltage of a photodiode receiving light may vary the voltage in an adjacent photodiode not receiving light. This will result in an inaccurate sensing of light in the adjacent photodiode. It would be desirable to provide a pixel structure that would minimize the effects of lateral depletion region growth from impinging on adjacent depletion regions.

BRIEF SUMMARY OF THE INVENTION

An image sensor with a plurality of photodiodes that each have a first region constructed from a first type of material and a second region constructed from a second type of material. Located adjacent to the first region and between second regions of adjacent photodiodes is a barrier region.

DETAILED DESCRIPTION

Disclosed is an image sensor with a plurality of photodiodes that each have a first region constructed from a first type of material and a second region constructed from a second type of material. Located adjacent to the first region and between second regions of adjacent photodiodes is a barrier region. The photodiodes are reversed biased to create depletion regions within the first regions. The barrier region limits the lateral growth of the depletions regions and inhibits depletion merger between adjacent photodiodes.

Figure 2:
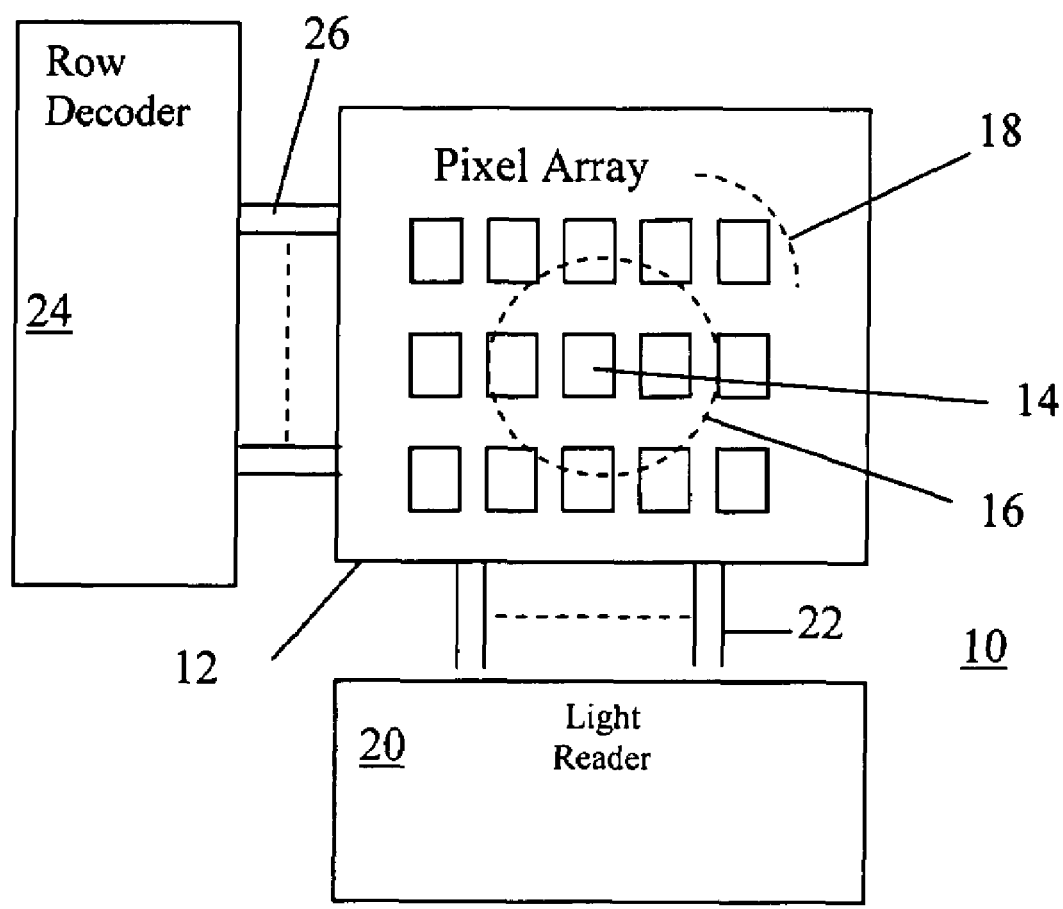
FIG. 2 is a schematic of an image sensor.

Referring to the drawings more particularly by reference numbers, FIG. 2 shows an image sensor 10. The image sensor 10 includes a pixel array 12 that contains a plurality of individual photo-detecting pixels 14. The pixels 14 are typically arranged in a two-dimensional array of rows and columns. The pixel array 12 has a center area 16 and corner areas 18.

The pixel array 12 is typically connected to a light reader circuit 20 by a plurality of conductive traces 22. The pixel array 12 is connected to a row decoder 24 by conductive traces 26. The row decoder 24 can select an individual row of the pixel array 12. The light reader 20 can then read specific discrete columns within the selected row. Together, the row decoder 24 and light reader 20 allow for the reading of an individual pixel 14 in the array 12. The data read from the pixels 14 may be processed by other circuits such as a processor (not shown) to generate a visual display.

The image sensor 10 and other circuitry may be configured, structured and operated in the same, or similar to, the corresponding image sensors and image sensor systems disclosed in U.S. Pat. No. 6,795,117 issued to Tay, which is hereby incorporated by reference.

Figure 1:
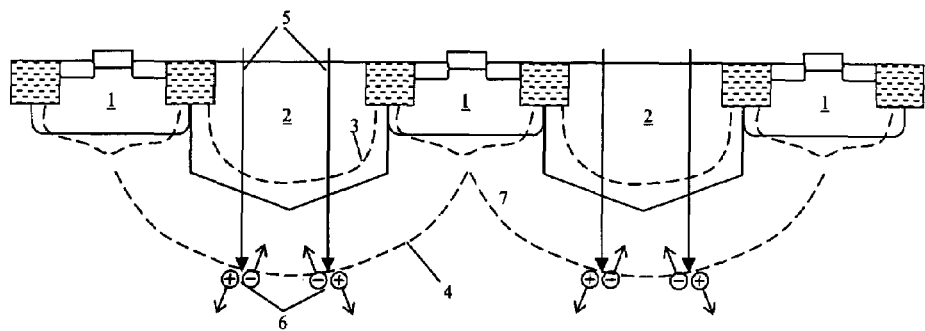
FIG. 1 is an illustration of an image sensor of the prior art.
Figure 3:
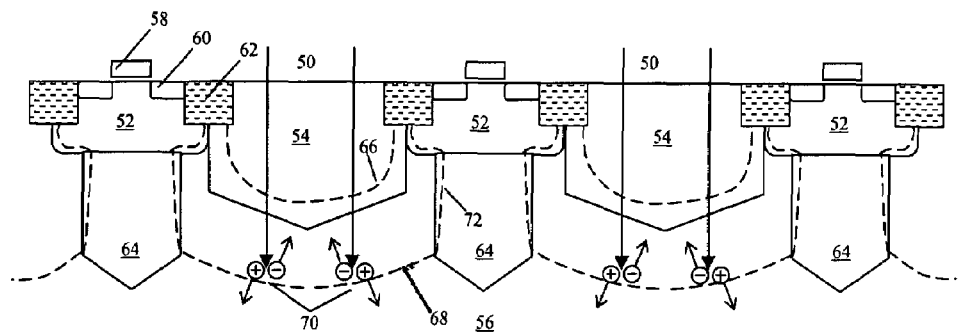
FIG. 3 is an illustration of a plurality of photodiodes of the image sensor.

FIG. 3 shows a plurality of photodiode pixels 50. Each photodiode 50 includes a first region 52 constructed from a first type of material and a second region 54 constructed from a second type of material. By way of example, the first material may be an intermediately doped p-type material and the second regions 52 may be a lightly doped n-type material. The regions 50 and 52 are formed on a substrate 56. The substrate 56 may be constructed from a lightly doped p-type material.

Each photodiode 50 may further have a gate 58 and either a source or drain pad 60 formed adjacent to the first region 52. The gate 58 may be constructed from a heavily doped n-type polysilicon material. The source/drain pad 60 may be constructed from a heavily doped n-type material. The n-type source/drain pads 60 may be separated from the n-type second regions 54 by insulating regions 62.

Adjacent to each first region 52 is a barrier region 64. The barrier region 64 may be constructed from a medium doped p-type material. The photodiodes 50 are reversed biased to create depletion regions generally within lines 66 and 68. Absorption of light and the formation of electron-hole pairs 70 at relatively long wavelengths of light will occur in the bottom portion of the depletion regions. By way of example, light with wavelengths longer than 650 nanometers tend to become absorbed at the bottom of the depletion regions.

The barrier regions 64 inhibit lateral growth of the depletion regions in the horizontal directions as represented by dashed lines 72. This prevents the depletion regions from merging and causing errant voltage variations in adjacent photodiodes. As shown in FIG. 3, the barrier regions 64 may extend as deep as the second regions 52. By way of example, the barrier regions may have a depth between 2-4 μm.

Figure 4:
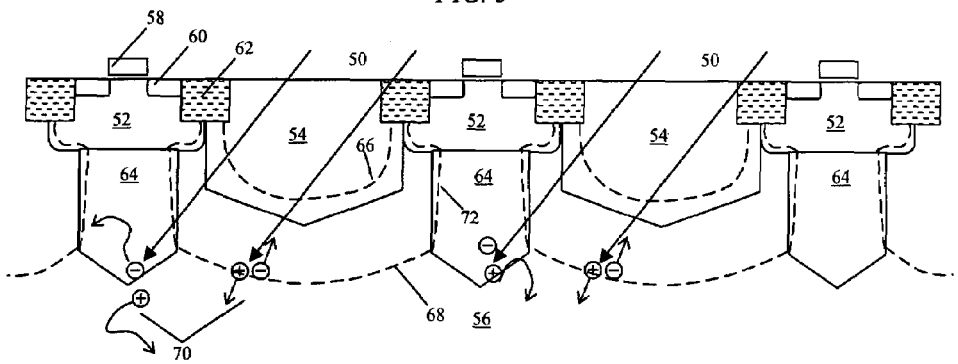
FIG. 4 is an illustration of photodiodes at a corner region of a pixel array of the image sensor.

As shown in FIG. 4, the light rays penetrate the photodiodes at an angle for pixels located at the corner areas 18 of the pixel array. The angle can be as much as 30 degrees. The incident light may be absorbed by material and form electron-hole pairs 70 in close proximity to an adjacent photodiode. The free electrons may migrate to the adjacent photodiode causing inaccurate photodetection.

Figure 5:
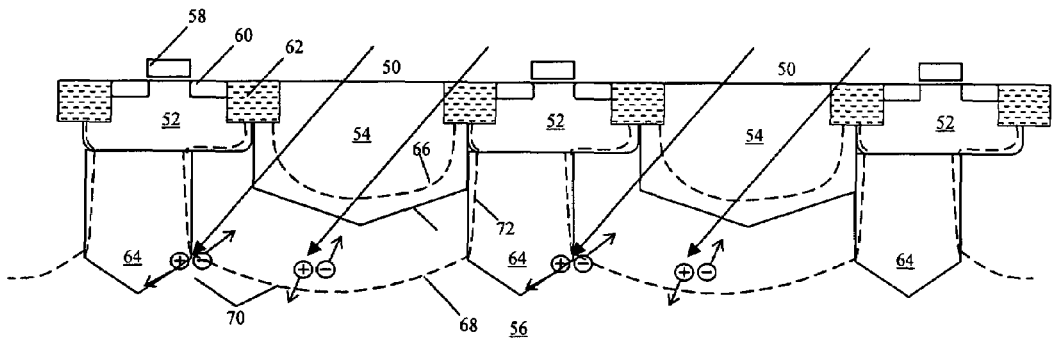
FIG. 5 is an illustration of photodiodes at the corner region, with offset barrier regions.

FIG. 5 is an embodiment where the barrier regions 64 are offset relative to the first regions 52. The offset barrier regions 64 create a longer path to an adjacent photodiode from the point when incident light is absorbed by the material. The offset may vary from the center of the pixel array, where the light penetrates the photodiodes in a perpendicular direction, to the outer pixels of the array where the light penetrates at a significant angle. The offset may become progressively larger from the center of the pixel array to the outer regions of the array. The offset allows the depletion region to grow laterally in the direction of the incoming light. By way of example, the barrier regions may be offset up to 0.5 μm at the outermost pixels.

The photodiodes may be constructed with known CMOS fabrication techniques. The barrier region 64 may be formed on the substrate 56. The first regions 52 may be formed on the barrier regions 64 and the gates 58 and pads 60 formed on the regions 52. The second regions 54 may also be formed on the substrate 56. The order of formation may vary depending on the processes used to create the image sensor.

While certain exemplary embodiments have been described and shown in the accompanying drawings, it is to be understood that such embodiments are merely illustrative of and not restrictive on the broad invention, and that this invention not be limited to the specific constructions and arrangements shown and described, since various other modifications may occur to those ordinarily skilled in the art.

What is claimed is:

1. An image sensor, comprising:
   a pixel array that includes a plurality of photodiodes that each have;
   a first region constructed from a first type of material;
   a second region constructed from a second type of material; and,
   a barrier region that is constructed from said first type of material, and located beneath said first region and between second regions of adjacent photodiodes.

2. The image sensor of claim 1, wherein said photodiodes are located in a corner area of said pixel array and said barrier region is offset from said first region.

3. The image sensor of claim 1, wherein said first type of material is a p-type material and said second type of material is an n-type material.

4. The image sensor of claim 1, wherein each photodiode includes a gate constructed from said second type of material.

5. The image sensor of claim 1, wherein said barrier region extends to a depth of a depletion region within said second region that absorbs light at a wavelength at least 650 nanometers.

6. An image sensor, comprising:
   a pixel array that includes a plurality of photodiodes that each have;
   a first region constructed from a first type of material;
   a second region that has a depletion region and is constructed from a second type of material; and,
   a barrier means for inhibiting lateral growth of said depletion region.

7. The image sensor of claim 6, wherein said photodiodes are located in a corner area of said pixel array and said barrier means is offset from said first region.

8. The image sensor of claim 6, wherein said first type of material is a p-type material and said second type of material is an n-type material.

9. The image sensor of claim 6, wherein each photodiode includes a gate constructed from said second type of material.

10. The image sensor of claim 6, wherein said barrier means extends to a depth of said depletion region that absorbs light at a wavelength at least 650 nanometers.

11. A method for forming a plurality of photodiodes of an image sensor, comprising:
    forming a barrier region on a substrate;
    forming a first region over the barrier region; and,
    forming a plurality of second regions on the substrate, the barrier region being located between the second regions.

12. The method of claim 11, wherein the first region is offset from the barrier region.

13. The method of claim 11, further comprising forming a first gate on the first region.

14. The method of claim 11, wherein the barrier region extends to a depth of a depletion region within the second region that absorbs light at a wavelength at least 650 nanometers.

* * * * *